United States Patent [19]

Matsumoto et al.

[11] 4,121,166

[45] Oct. 17, 1978

[54] PHASE SYNCHRONIZING CIRCUIT FOR DEMODULATION OF MULTI-PHASE PSK SIGNALS

[75] Inventors: Youichi Matsumoto; Yoshimi Tagashira, both of Tokyo, Japan

[73] Assignee: Nippon Electric Co., Ltd., Tokyo, Japan

[21] Appl. No.: 850,518

[22] Filed: Nov. 11, 1977

[30] Foreign Application Priority Data

Nov. 11, 1976 [JP] Japan .................. 51-136044

[51] Int. Cl.² .............................................. H03D 3/02
[52] U.S. Cl. ......................................... 329/122; 331/4
[58] Field of Search .............. 329/122, 123, 124, 125; 331/4; 328/155

[56] References Cited

U.S. PATENT DOCUMENTS

| | | | |
|---|---|---|---|
| 3,600,700 | 8/1971 | Matsuo ................................... | 331/12 |
| 3,958,186 | 5/1976 | Jesse ....................................... | 331/4 |
| 4,000,476 | 12/1976 | Walker ................................... | 329/122 |
| 4,039,961 | 8/1977 | Ishio et al. ............................. | 329/50 |

*Primary Examiner*—John Kominski

*Attorney, Agent, or Firm*—Sughrue, Rothwell, Mion, Zinn and Macpeak

[57] ABSTRACT

A phase synchronizing circuit for the demodulation of multi-phase PSK signals has a broadened capture frequency range while avoiding false capture. The circuit includes a phase synchronizing loop having a voltage controlled oscillator for generating a variable frequency output in response to a control voltage and a phase comparator for providing a comparison output representative of the phase difference between the output of the voltage controlled oscillator and an input signal. The comparison output serves as the control voltage for the voltage controlled oscillator. A phase-lock detection circuit is connected to the phase synchronizing loop to detect the phase-synchronized or unsynchronized states of the loop. A low frequency sweep generator is responsive to the phase-lock detection circuit for generating a variable-amplitude voltage which is supplied as a frequency sweep voltage to the voltage controlled oscillator. The frequency sweep voltage is provided for a period of time running from the detection by phase-lock detection circuit of the phase unsynchronized state to a predetermined period of time after the detection of the change from the phase unsynchronized state to the synchronized state.

5 Claims, 9 Drawing Figures

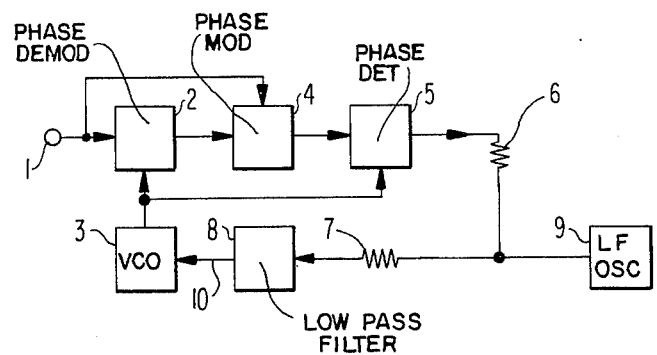
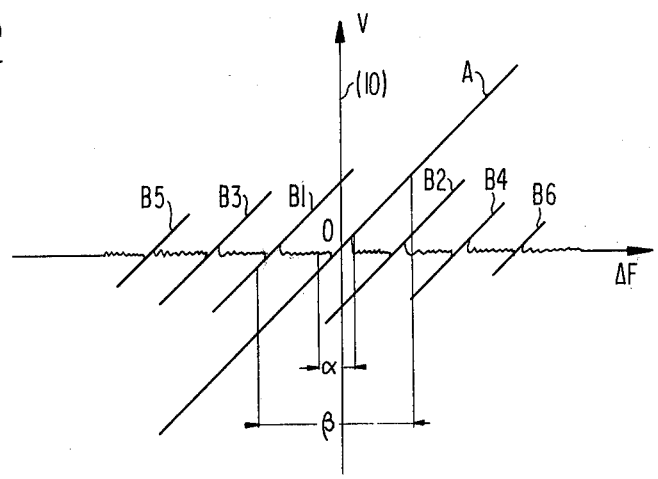
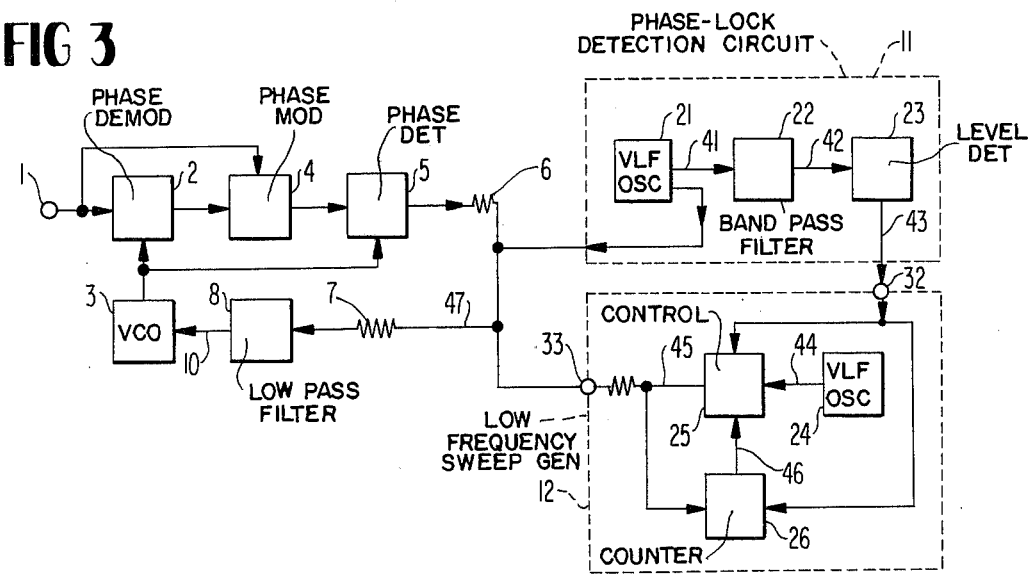

PHASE SYNCHRONIZING CIRCUIT FOR DEMODULATION OF MULTI-PHASE PSK SIGNALS

BACKGROUND OF THE INVENTION

The present invention relates to a phase synchronizing circuit for the demodulation of multi-phase PSK signals, and more particularly, to the circuit of this type having a broadened capture frequency range without causing false capture.

Various attempts have been made to broaden the frequency range within which the recovered carrier wave for PSK demodulation is brought to a phase-synchronized state. Such frequency range is often called a capture frequency range. One of the proposals is disclosed in Japanese Pat. No. 837,502 (Japanese Patent Publication No. 51-10752) invented by Yoshio Matsuo.

The circuit proposed in this Japanese patent employs a low frequency oscillator coupled to the phase synchronizing loop, which has a phase comparator and a voltage controlled oscillator (VCO). The output of the low frequency oscillator is superimposed on the control voltage supplied through the loop and applied to the VCO for frequency sweep. So long as phase synchronization is not established, the loop exhibits an appreciable impedance and keeps the low frequency oscillator on so that the VCO continues the frequency sweep. Once the phase synchronization is achieved, the loop turns low in impedance, causing the low frequency oscillator to stop oscillation, thereby stopping the frequency sweep by one VCO.

When this phase synchronizing circuit is employed in a demodulator circuit for an N-phase phase-modulated signal, the phase-synchronized state is established not only at the desired center frequency but also at frequencies deviated by fc/n therefrom ($n$ being a positive integer and $fc$ representing the clock frequency), causing the false capture. Once the phase-synchronized state is established, whether it is a desired or false capture, the oscillation at the low frequency oscillator is stopped due to the lowered loop impedance. Therefore, if the phase-synchronized state is due to a false capture, the recovery of the desired phase synchronization is rendered impossible. The correct demodulation of the N-phase phase-modulated signal is accordingly rendered impossible.

SUMMARY OF THE INVENTION

One object of the present invention is therefore to provide a phase synchronizing circuit which can obviate the aforementioned false capture while broadening the capture frequency range.

According to the present invention, there is provided a phase synchronizing circuit in which the phase-synchronized and unsynchronized states of phase synchronizing loop are detected by a detecting means separate from the low frequency oscillator for the frequency sweep, and in which the frequency sweep is maintained for a predetermined period of time after the detection of the phase-synchronized state, thereby broadening the false capture-free frequency range in which the phase synchronized state can be restored.

BRIEF DESCRIPTION OF THE DRAWINGS

FIG. 1 is a block diagram of a conventional phase synchronizing circuit;

FIG. 2 shows characteristic curves of the circuit shown in FIG. 1;

FIG. 3 is a block diagram of a first preferred embodiment of the present invention;

DESCRIPTION OF THE PREFFERED EMBODIMENTS

Figure 4:
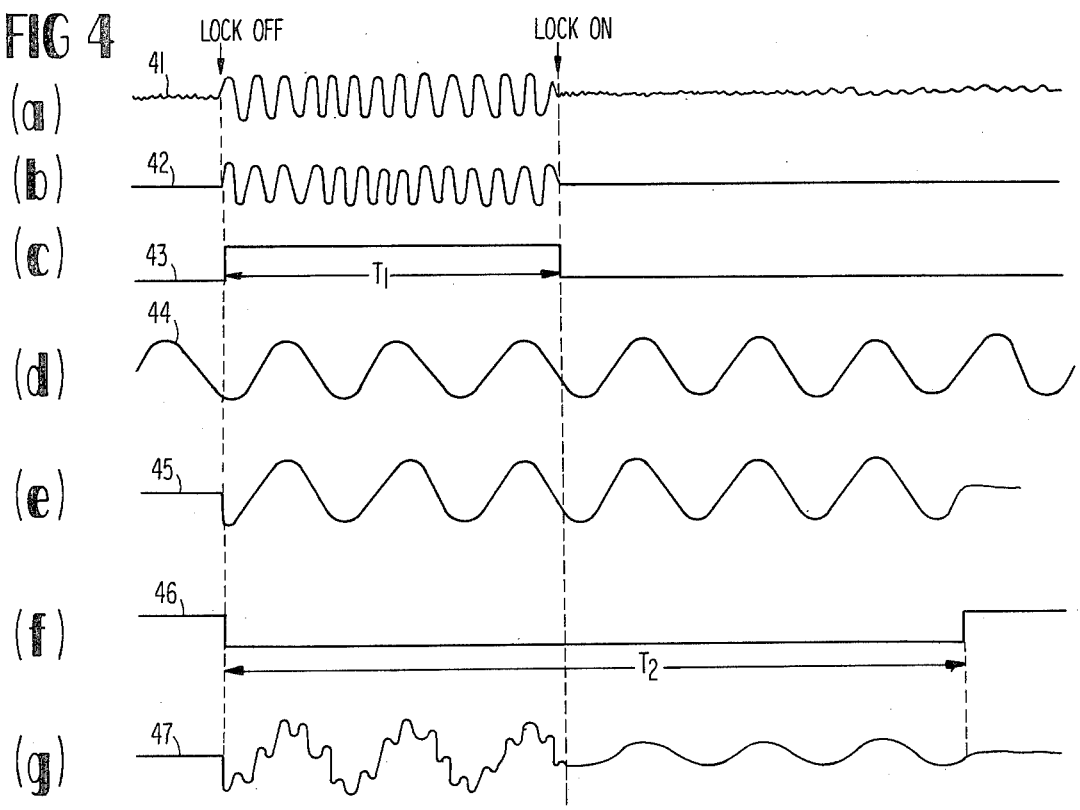
FIG. 4 is a waveform diagram for describing the operation of the embodiment shown in FIG. 3.

The conventional phase synchronizing circuit of the reverse-modulation system illustrated in FIG. 1 comprises an N-phase phase demodulator circuit 2 having an input terminal 1. A VCO 3 supplies a reference carrier wave to the N-phase phase demodulator 2, and an N-phase phase modulator 4 is connected to the output of demodulator 2 and also to input terminal 1. The output of modulator 4 is connected to a phase detector circuit 5 which also receives the reference carrier wave from VCO 3. Resistors 6 and 7 and a low-pass filter 8 complete the phase-lock loop. A low frequency oscillator for frequency sweep is connected to the junction of resistors 6 and 7.

An N-phase phase-modulated signal applied to the signal input terminal 1 is phase-demodulated in the N-phase phase demodulator circuit 2 by employing the output signal from the VCO 3 as a reference carrier wave. On the other hand, the input signal branched at the input terminal 1 is also applied to the N-phase phase modulator circuit 4, where the input signal is phase-modulated with the demodulated output from the N-phase phase demodulator circuit 2. Since this N-phase phase modulator circuit 4 effects phase modulation upon the N-phase phase-modulated input signal so as to cancel its modulation component, an unmodulated carrier wave signal is recovered at the output of the N-phase phase modulator circuit 4. This carrier wave signal is applied to the phase detector circuit 5 where it is phase compared with the output of the VCO 3. The output of this detector circuit 5 is applied to the VCO 3 through the resistors 6 and 7 and the low-pass filter 8 to control the VCO output frequency so as to achieve the phase synchronization.

On the other hand, the low-frequency oscillator 9 is connected to a junction between the resistors 6 and 7. When this phase-lock loop is in a phase-synchronized captured state, the impedance as seen from the junction between the resistors 6 and 7 into the phase-lock loop is very low, as described above, so that the oscillator 9 stops oscillation. However, when the phase-lock loop is out of phase synchronism, the above-mentioned impedance of the loop becomes equal to $(R_1 \times R_2 / R_1 + R_2)$ (for instance, 500 ohm) where $R_1$ and $R_2$ (for instance, 1 kiloohm) represent the resistances of the resistors 6 and 7, respectively. Since the impedance is fairly high under this unsynchronized state, the oscillator 9 starts oscillation to cause the low frequency oscillation output to be superimposed on the loop control voltage, thereby causing the frequency sweep at the VCO 3. The frequency sweep broadens the capture frequency range.

However, in a phase synchronizing circuit having an N-phase phase-modulated wave applied thereto as an input signal, the so-called false capture would occur, in which capture arises at frequencies deviated by $fc/n$ as stated above. The mode of the false capture will be described with reference to FIG. 2.

In FIG. 2, reference letter $\alpha$ represents a capture range in the case where the low frequency oscillator 9 for the frequency sweep is not used; $\beta$, a desired capture range which is wider than $\alpha$; A, a characteristic curve for a desired phase synchronization; and $B_1 \sim B_6$, characteristic curves for false phase synchronization. It is to be noted that the wavy curve shown along the abscissa represents unsynchronized states. Normally, when the oscillator 9 for the sweep is not used, a capture range is as narrow as $\alpha$. However, once the phase-locked or synchronized state is achieved, the frequency range in which the phase-locked state is maintained is broadened as shown by the characteristic curve A. On the other hand, while the capture frequency range of the phase-lock loop depends upon the loop gain, frequency response and delay characteristics, phase comparison characteristics, and the like of the loop, it is known that in general a normal capture range is broader than a false capture range as shown in FIG. 2.

In the conventional circuit, if the frequency capture range is broadened as shown at $\beta$ by increasing the output voltage of the oscillator 9, the circuit tends to be phase-locked under the false capture state as represented by the characteristic curve $B_1$ or $B_2$. Under such state, the internal impedance of the phase synchronizing loop is lowered so that the oscillation of the oscillator 9 is stopped to lock the synchronized state onto the characteristic curve $B_1$ or $B_2$. Once a false capture has been made, there is practically no possibility of recovery of the desired phase-synchronized state because the frequency sweep is stopped.

In FIG. 3, showing a first embodiment of the present invention, like reference numerals are given to like structural elements shown in FIG. 1. This preferred embodiment differs from the conventional circuit of FIG. 1 in that a combination of a phase-lock detection circuit 11 and a low frequency generator sweep 12 is substituted for the low frequency oscillator 9 of FIG. 1.

This phase-lock detection circuit 11 is composed of a first oscillator 21 for generating a very low frequency oscillation 41 of several tens Hz at such low level that it does not effect the phase-lock loop, a band-pass filter 22 for letting pass only the frequency of this signal 41, and a level detector 23 for sensing the level of the output signal 42 from the band-pass filter 22 to determine whether the phase synchronization is established.

Since the output signal 41 from the first oscillator 21 is supplied to the junction between the resistors 6 and 7, it functions similarly to the oscillator 9 of the conventional circuit of FIG. 1; more specifically, it provides oscillation 41 when the phase-lock loop is out of phase synchronism but stops oscillation when the loop is in the synchronized state as shown in FIG. 4(a). This signal 41 is shaped by the band-pass filter 22 as shown in FIG. 4(b). Further, a level higher than a predetermined threshold value is detected by the level detector 23, which provides a gate signal 43 that takes a value "1" during the period $T_1$ extending from the moment of the collapse of the phase-synchronized state to its restoration as shown in FIG. 4(c). The gate signal 43 is fed to the subsequent low frequency sweep generator 12 as a control signal.

On the other hand, the low frequency sweep generator 12 for the frequency sweep at the VCO 3 is composed of a second oscillator 24 for generating a frequency lower than the first oscillation frequency (for instance, several Hz), a control circuit 25 for controlling ON/OFF of the oscillation signal 44, and a counter circuit 26 for counting a predetermined number of waves in a frequency sweep signal 45 which is obtained at the output of the control circuit 25.

In operation, the second oscillator circuit 24 continuously provides an oscillation signal 44 as shown in FIG. 4(d). The control signal 43 from the phase-lock detection circuit 11 is fed to an input terminal 32. It should be noted that when the phase-lock loop gets out of a phase-synchronized state to an unsynchronized state, the control signal 43 is turned from "0" to "1". Thus, in response to the rise of this signal, the control circuit 25 is opened. Accordingly, the sweep signal 45 as shown at FIG. 4(e) is fed to the phase-lock loop so that the VCO 3 provides frequency sweep oscillation in response to the sweep signal 45. Under this state, the counter 26 has not yet started counting.

Subsequently, when either the desired or a false capture has been established, the control signal 43 becomes "0" so that in response to the fall of this signal counter circuit 26 starts counting the output signal 45 until the counter circuit 26 feeds a count-up signal to the control circuit 25 to shut off the feeding of the sweep signal 45. Consequently, the control circuit 25 keeps feedng the frequency sweep signal during the period $T_2$ as shown at FIG. 4(f). The period $T_2$ is the sum of the period $T_1$ and the predetermined period of counting, and, therefore, the frequency sweep is continued for a predetermined period after the synchronization has been established. It should be noted that as shown at FIG. 4(g) the signal at the junction of the resistors 6 and 7 has a waveform consisting of the frequency sweep signal 45 and the oscillation signal 41 superimposed thereon at a lower level under the phase-unsynchronized state. Under the phase-synchronized state, the internal impedance of the loop is lowered, with the result that only the frequency sweep signal 45 remains with a reduced amplitude.

Figure 5:
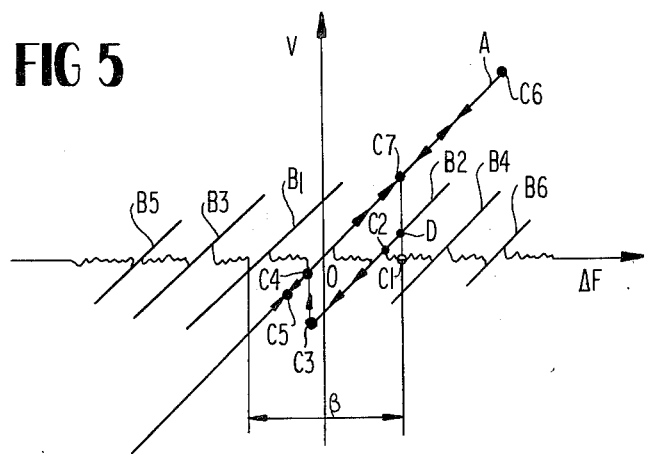
FIG. 5 is a diagram similar to FIG. 2 showing one example of characteristics of the circuit shown in FIG. 3.

Now the restoration of the desired phase-synchronized state from a false capture will be explained with reference to FIG. 5. In this figure, like reference letters are given to like elements shown in FIG. 2 and arrows represent the process of state change. It is assumed in FIG. 5 that the frequency sweep starts with a point $C_1$ in the direction of a smaller frequency difference $\Delta F$. In this case, the operating point is shifted leftwards from the point $C_1$. At a point $C_2$, a false capture takes place as represented by a characteristic curve $B_2$. The frequency sweep is then further continued from the point $C_2$ towards a point $C_3$. The amplitude of the signal 45 is set so that the frequency sweep range is large enough to exceed the false capture range represented by the characteristic curve $B_2$. As a result the operating point shifts to a point $C_4$ in the normal captured state, leaving the point $C_3$, and further towards a maximum sweep point $C_5$. Still further, the frequency sweep shifts the operating point towards the maximum sweep point $C_6$. After the shifting of the operating point back and forth between the points $C_5$ and $C_6$ by the times determined by the counter circuit 26 (that is, for the period $T_2$-$T_1$), the frequency sweep terminates at a point $C_7$. Owing to the frequency sweep sustained for a predetermined time period even after the phase synchronism is established, the restoration of the normal capture is facilitated even if the loop should be initially locked in a false capture state.

Figure 6:
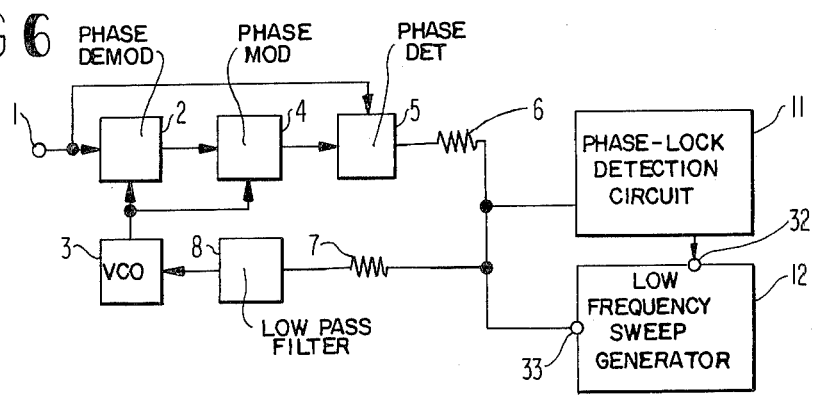
FIGS. 6 and 7 are block diagrams of second and third preferred embodiments, respectively, of the present invention.
Figure 7:
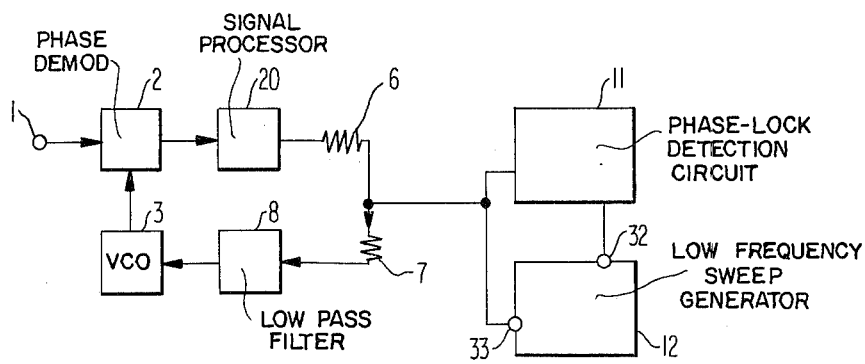

While the present invention has been described above in connection with a preferred embodiment as applied to a phase synchronizing circuit for the demodulation of an N-phase phase-modulated signal based on the reverse-modulation, another embodiment as applied to a phase synchronizing circuit for the remodulation type demodulator is illustrated in FIG. 6, and still another embodiment as applied to the base-band signal processing-type demodulator is illustrated in FIG. 7.

A phase synchronizing circuit for the remodulation-type demodulator or the reverse-modulation-type demodulator is well-known. An example is shown in U.S. Pat. No. 4,039,961. The circuit of FIG. 6 for the remodulation-type demodulator has the same structural elements as those of the circuit in FIG. 3. In these drawings, like reference numerals denote like structural elements. In FIG. 6, the demodulated signal from demodulator 2 is modulated again at modulator 4, whose remodulated output is phase compared with the input signal at phase comparator 5.

In FIG. 7, reference numeral 20 designates a signal processing circuit having an output signal from a phase demodulator circuit applied to its input to generate a phase synchronizing signal. For further details of this circuit, reference is made to U.S. Pat. No. 3,600,700.

Figure 8:
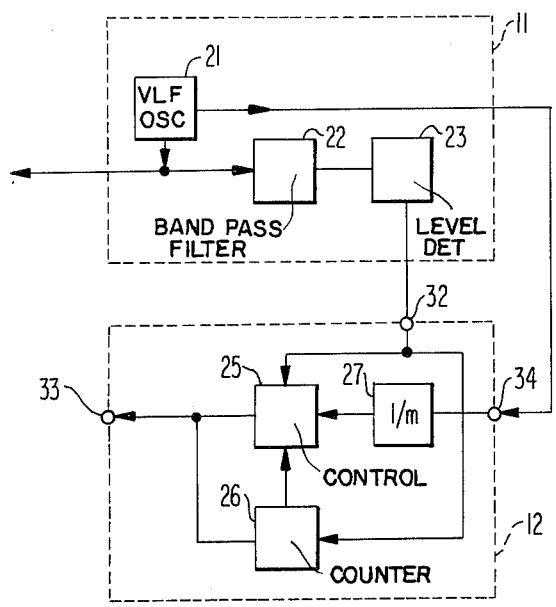
FIG. 8 is a block diagram of a detailed example of an oscillator circuit and a synchronization decision circuit for use in the phase synchronizing circuit of the present invention.

In FIG. 8, showing another example of the low frequency sweep generator 12, reference numeral 27 designates a frequency divider circuit having a division factor of 1/m. The output of the first oscillator circuit 21 is applied to an input terminal 34 of the oscillator 12, and this signal is frequency-divided by a factor of 1/m to be used as the oscillation signal 44. Accordingly, this modified embodiment necessitates only a reduced number of oscillators.

Figure 9:
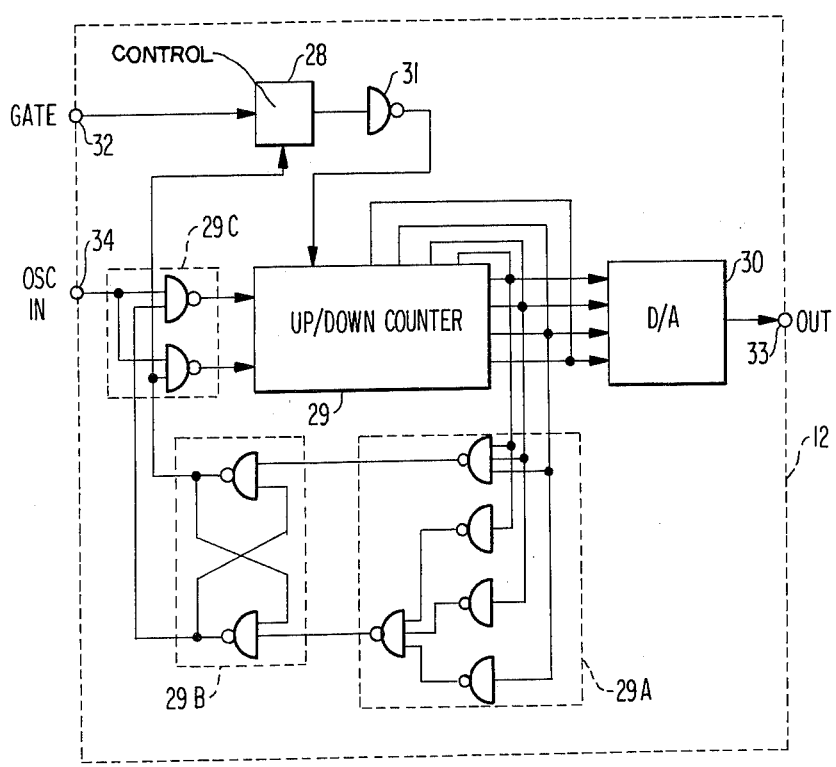
FIG. 9 is a block diagram of another example of an oscillator circuit for use in the phase synchronizing circuit of the present invention.

As another example of the generator 12, the second oscillator and its control circuit may be digital circuits as shown in FIG. 9, in which like reference numerals denote like structural elements. When the signal 43 representing the change of phase-synchronized state to unsynchronized state is applied from input terminal 32 of the oscillator circuit 12 to a control circuit 28, a signal which is turned ON in response to the rise of the signal 43 is fed to a reversible counter 29 to select up-count (or down-count) so as to start the counting of a predetermined oscillation signal which is continuously fed through input terminal 34. When the counting at the counter 29 reaches a predetermined value, it reverses the direction of the counting from down-count to up-count or vice versa, due to the logic circuits 29A, 29B and 29C, so that both the up-count and down-count are alternately repeated. Accordingly, when the counter output is subjected to D/A conversion in a D/A converter 30, a triangular wave is derived from output terminal 33. In addition, a down-count designation signal from the logic circuit 29B is applied to the control circuit 28. The control circuit 28 counts, in response to the rise of the control signal upon change from the phase-unsynchronized to the synchronized state, the down-count selection signals up to a predetermined number. In response to the up-count signal, the counting operation of the reversible counter 29 is stopped. In this embodiment, the output of the logic circuit 29B supplied to the control circuit 28 may be the up-count designation signal.

Several figures will now be given to show the technological advantage of the present invention over the conventional circuit as shown in FIG. 1. When the circuit of FIG. 1 is applied to the demodulator for a carrier wave of 10.7MHz four-phase phase-modulated at a clock frequency ($fc$) of 1.54MHz, false capture takes place at 10.7MHz ± 385KHz (i.e., $f_c/4$) and 10.7MHz ± 193KHz ($f_c/8$). If a specific digital code such as "1100," or "010" is received repeatedly, there is a greater possibility of the false capture additionally at other frequencies. Furthermore, the frequency range ($\alpha$ shown in FIG. 2) within which the phase-synchronized state can be restored without causing the false capture is only ±100KHz. In contrast, the above-described embodiments of the present invention broaden the false capture-free range up to ±250KHz.

While the preferred embodiments of the present invention have been described above assuming the maintenance of the frequency sweep for a predetermined period of time after the detection of the change from the phase-unsynchronized state to a synchronized state, the principle of the invention is applicable to such a case where the frequency sweep is sustained for a predetermined period of time starting after the collapse of the phase-synchronized state if the time needed for the restoration can be predicted. Also, it is to be noted that the resistors 6 and 7 may be given an impedance equal to the output impedance of the phase detector circuit 5 and the input impedance of the low-pass filter circuit 8, respectively.

As described above, the present invention makes it possible to effect a stable and normal capture in a phase synchronizing circuit in which false capture may arise, as is the case with the phase synchronizing circuit for N-phase phase demodulation.

What is claimed is:

1. In a phase synchronizing circuit for the demodulation of multi-phase PSK signals comprising a phase synchronizing loop, including a voltage controlled oscillator for generating a variable frequency output in response to a control voltage and a phase comparator for providing a comparison output representative of the phase difference between the output of said voltage controlled oscillator and an input signal, said comparison output serving as said control voltage, the improvement wherein said phase synchronizing circuit further comprises:

phase synchronization detector means connected to said phase synchronizing loop for detecting the phase-synchronized and unsynchronized states of said loop;

low frequency oscillator means connected to receive the output of said phase synchronizing detector means for generating a predetermined variable-amplitude voltage supplied as a frequency sweep voltage for said voltage controlled oscillator during a period of time, said period of time running from the detection at said detector of the phase-unsynchronized state to a predetermined period of time after the detection of the change from the phase-unsynchronized state to the synchronized state; and means for supplying the output of said low frequency oscillator to said phase synchronizing loop.

2. A phase synchronizing circuit as claimed in claim 1 wherein said phase synchronization detector means consists of an oscillator having a predetermined oscillation frequency and means for detecting the level of the oscillation output of said oscillator, said oscillator being connected to said phase synchronizing loop and responsive to the phase-synchronized and unsynchronized states of said loop to stop or start oscillation, respectively.

3. A phase synchronizing circuit as claimed in claim 2 wherein said low frequency oscillator means comprises a digital circuit, including a reversible counter having its output connected to a D/A converter, said counter receiving as a count input the output of said oscillator, means connected to said counter for periodically reversing the direction of counting, and control means responsive to said means for detecting the level of the oscillation output for inhibiting said counter after said predetermined period of time.

4. A phase synchronizing circuit as claimed in claim 2 wherein said low frequency oscillator means comprises a second oscillator having a predetermined oscillation frequency which is at least an order of magnitude less than that of the oscillator in said phase synchronization detector means, a control means connected to the output of said second oscillator and responsive to the detection of said unsynchronized state by the output of said means for detecting the level of the oscillation output for passing the output of said second oscillator, and counter means connected to said control means and responsive to the detection of said synchronized state by the output of said means for detecting the level of the oscillation output for causing said control means to block the output of said second oscillator after said predetermined period of time.

5. A phase synchronizing circuit as claimed in claim 2 wherein said low frequency oscillator means comprises a frequency divider connected to the output of said oscillator and producing an output oscillation frequency which is a sub-multiple of that of said oscillator, a control means connected to the output of said frequency divider and responsive to the detection of said unsynchronized state by the output of said means for detecting the level of the oscillation output for passing the output of said frequency divider, and counter means connected to said control means and responsive to the detection of said synchronized state by the output of said means for detecting the level of the oscillation output for causing said control means to block the output of said frequency divider after said predetermined period of time.

* * * * *